United States Patent [19]
Tomita

[11] Patent Number: 4,516,312
[45] Date of Patent: May 14, 1985

[54] METHOD FOR CONSTRUCTING DELAY CIRCUITS IN A MASTER SLICE IC

[75] Inventor: Masayoshi Tomita, Kawasaki, Japan

[73] Assignee: Fujitsu Limited, Kawasaki, Japan

[21] Appl. No.: 347,464

[22] Filed: Feb. 10, 1982

[30] Foreign Application Priority Data

Feb. 12, 1981 [JP] Japan .................................. 56-19310

[51] Int. Cl.³ ............................................ H01L 29/78
[52] U.S. Cl. .................................... 29/571; 9/577 C; 148/1.5; 357/23.6; 357/23.14
[58] Field of Search ................ 29/571, 577 C, 577 R; 148/1.5; 357/23 C, 23 MG, 42, 44, 41

[56] References Cited

U.S. PATENT DOCUMENTS

| | | | |
|---|---|---|---|
| 3,564,442 | 2/1971 | Germann | 357/23 MG X |
| 3,714,522 | 1/1973 | Kamiya et al. | 357/23 MG |
| 3,999,210 | 12/1976 | Yamada | 357/23 MG |
| 4,092,619 | 5/1978 | Huggins | 357/23 C X |
| 4,141,023 | 2/1979 | Yamada | 357/23 MG |
| 4,157,557 | 6/1979 | Sato et al. | 357/23 |
| 4,158,239 | 6/1979 | Bertin | 357/23 MG |
| 4,285,001 | 8/1981 | Gerzberg et al. | 357/23 C X |
| 4,412,237 | 10/1983 | Matsumura et al. | 357/42 |

FOREIGN PATENT DOCUMENTS

WO79/00461 7/1979 PCT Int'l Appl. .

OTHER PUBLICATIONS

IEEE Transactions on Circuits and Systems, vol. CAS-28, No. 8, Aug. 1981, New York, S. M. Kang, "A Design of CMOS Polycells for LSI Circuits", pp. 838–843.

*Primary Examiner*—Brian E. Hearn
*Assistant Examiner*—David A. Hey
*Attorney, Agent, or Firm*—Staas & Halsey

[57] ABSTRACT

A method for constructing delay circuits in a master slice IC formed on a semiconductor substrate. The master slice IC comprises regularly arranged MIS transistors having gate electrodes. The MIS transistors includes various logic circuits. A delay circuit is formed between two logic circuits. The delay circuit comprises a resistor and a capacitor. The resistor is constructed using the resistances of the gate electrodes by sequentially connecting the gate electrodes between two logic circuits. The capacitor is constructed using capacitances formed between the gate electrodes and the semiconductor substrate. A precise delay time of a delay circuit having a small area can be obtained.

5 Claims, 8 Drawing Figures 4,516,312

METHOD FOR CONSTRUCTING DELAY CIRCUITS IN A MASTER SLICE IC

BACKGROUND OF THE INVENTION

This invention relates to a method for constructing delay circuits in an integrated circuit (IC) formed by a master slice approach (hereinafter referred to as a master slice IC).

ICs generally require delay circuits to eliminate differences in operating speeds among elements, etc. Master slice ICs, however, do not have the elements for delay circuits. Unlike full custom ICs, they are composed of a plurality of transistors, or basic cells, of identical patterns formed beforehand on a semiconductor substrate (see, for example, U.S. Pat. No. 3,943,551, Skorup, LSI Array Using Field Effect Transistor of Different Conductive Type) and only require selective connection of the transistors by an aluminum wiring to obtain the desired logic gates, such as inverters. Therefore, it is difficult at the wiring stage to add resistance and capacitance (RC) elements on the semiconductor substrate to construct the delay circuits.

To obtain the necessary delay time in master slice ICs, therefore, the signal transmission times through the logic gates are conventionally utilized. However, the signal transmission times through a logic gate, i.e., the delay time from the input time to the output time of a logic gate, is very small. Therefore, a great number of logic gates must be connected in series in order to obtain the desired delay time. Further, the delay time derived from a logic gate varies depending on the position in which the logic gate is arranged, the capacitance of the wiring lines, the temperature, and the manufacturing process. For example, the transmission delay time of a one-stage inverter may vary from half to twice a standard value, depending on the conditions. Therefore, it is difficult to precisely obtain a desired delay time by utilizing conventional logic gates in master slice ICs.

SUMMARY OF THE INVENTION

Accordingly, an object of the present invention is to provide a method for easily constructing delay circuits, including resistances and capacitances, in a master slice IC. According to the present invention, there is provided a method for constructing delay circuits in a master slice IC, the method including the steps of forming a plurality of basic cells on a semiconductor substrate, each of the basic cells including MIS transistors having a gate electrode formed over the semiconductor substrate through an insulating film and selecting a wiring pattern for connecting the MIS transistors to form various logic circuits. The method further includes the step of connecting one or more of the gate electrodes of the MIS transistors to form a delay circuit between two of the logic circuits, the delay circuit including a resistance derived from the gate electrodes and a capacitance formed between the gate electrodes and the semiconductor substrate.

The above object and other objects as well as the characteristic features of the invention will become more apparent and readily understandable by the following description and the appended claims when read in conjunction with the accompanying drawings.

DESCRIPTION OF THE PREFERRED EMBODIMENT

Before describing the embodiment of the present invention, a master slice IC will first be described with reference to FIGS. 1 through 4.

Figure 1:
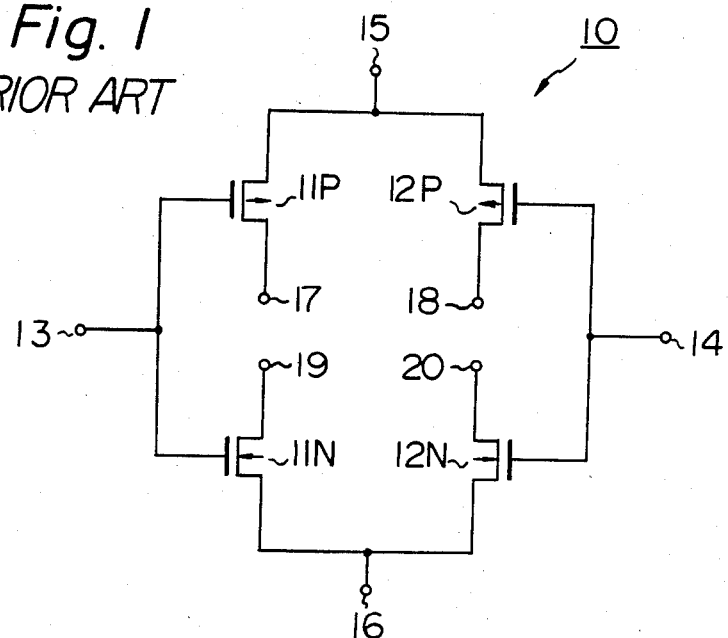
FIG. 1 is a circuit diagram of an equivalent circuit of a conventional basic cell formed on a master slice IC.

FIG. 1 is a circuit diagram of an equivalent circuit of a conventional basic cell formed on a master slice IC. Referring to FIG. 1, a basic cell 10 includes two P-channel MIS transistors 11P and 12P, and two N-channel MIS transistors 11N and 12N. The sources (or drains) of the transistors 11P and 12P are connected to a terminal 15. The sources (or drains) of the transistors 11N and 12N are connected to a terminal 16. The gates of the P-channel transistor 11P and the N-channel transistor 11N are connected to a terminal 13. The gates of the P-channel transistor 12P and the N-channel transistor 12N are connected to a terminal 14. The sources (or drains) connected to terminals 17 and 18 of the P-channel transistors 11P and 12P, and the drains (or sources) connected to terminals 19 and 20 of the N-channel transistors 11N and 12N, are electrically separated from each other.

By electrically connecting the terminals 17 through 20 in a desired wiring pattern, a desired logic circuit, for example, a logic circuit including inverters, can be obtained.

Figure 2:
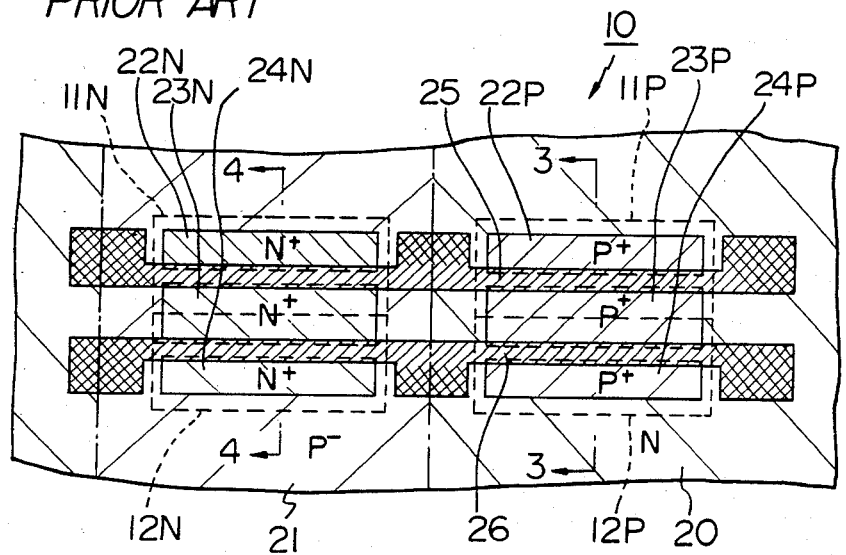
FIG. 2 is a plan view of the conventional basic cell of FIG. 1 formed on the master slice IC.
Figure 3:
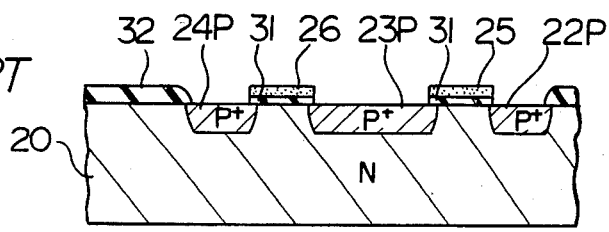
FIG. 3 is a cross-sectional view taken along line 3—3 of FIG. 2.
Figure 4:
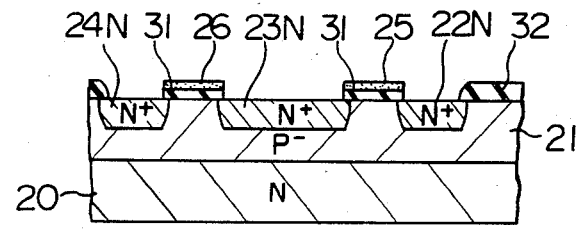
FIG. 4 is a cross-sectional view taken along line 4—4 of FIG. 3.

The physical structure of the basic cell of FIG. 1 is illustrated in FIGS. 2 through 4. FIG. 2 is a plan view of the block formed on the master slice IC. FIGS. 3 and 4 are cross-sectional views taken along lines 3—3 and 4—4, respectively, of FIG. 2. Referring to FIGS. 2 through 4, the transistors 11P and 12P are formed on an N-type semiconductor substrate 20. The transistors 11N and 12N are formed on a P⁻-type diffusion region 21 which is formed on the N-type semiconductor substrate 20 (see FIG. 4). Regions 22N, 23N and 24N are N⁺-type diffusion regions formed at the surface of the P⁻-type diffusion region 21. The region 22N and the region 23N are drain and source regions of the transistor 11N. The region 23N and the region 24N are source and drain regions of the transistor 12N. Regions 22P, 23P, and 24P are P⁺-type diffusion regions formed at the surface of the N-type semiconductor substrate 20. The region 22P and the region 23P are drain and source regions of the transistor 11P. The region 23N and the region 24N are source and drain regions of the transistor 12P. Conductive layers 25 and 26 are formed on the surface of the semiconductor substrate 20 and on the P⁻-type diffusion region 21 through insulating layers 31. The conductive layer 25 forms the gate electrodes of the transistors 11N and 11P. The conductive layer 26 forms the gate electrodes of the transistors 12N and 12P.

Although only one basic cell 10 is illustrated in FIGS. 2 through 4, it is apparent that, in a master slice IC, there are a plurality of basic cells regularly arranged on the semiconductor substrate. Note that there is no resistor element or capacitor element in the master slice IC. Therefore, when a delay circuit is required in the master slice IC, a desired number of logic gates, such as inverters, are conventionally connected in series. Referring back to FIG. 1, two inverters are obtained by connecting the terminal 17 to the terminal 19, the terminal 18 to the terminal 20, and the connecting point between the terminals 17 and 19 to the terminal 14. As mentioned before, because the delay time obtained by one inverter is only about 1 nano second, a plurality of inverters, for example, 100 inverters, must be connected in series in order to obtain a desired delay time of, for example, 100 nano seconds. An inverter used for such a delay circuit cannot be used as a logic gate itself. Therefore, the conventional method for obtaining a delay circuit in a master slice IC greatly limits the area used for logic gates. Further, because the inverters used for a delay circuit are wired together by computer aided design, the capacitance of the wiring lines cannot be estimated before the layout of the inverters is performed. Moreover, as mentioned before, the delay time derived from an inverter varies depending on the position on which the inverter is arranged, temperature, or manufacturing process. Therefore, the delay time derived from the inverters cannot be precisely designed before the inverters are laid out.

An embodiment of the present invention will now be described in detail. According to the present invention, resistances of the conductive layers 25 and 26 (FIGS. 2 through 4) and capacitances between the conductive layer and the semiconductor substrate 20 or between the conductive layer and the P⁻-type diffusion region 21 are used for delay circuits.

Figure 5A:
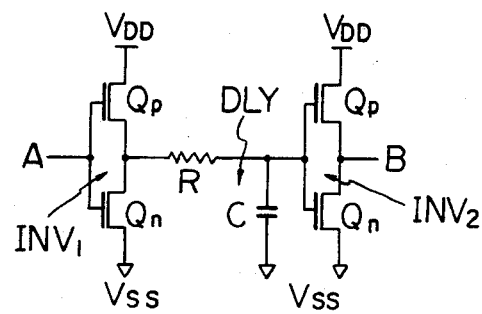
FIG. 5A is a circuit diagram of a basic cell including a delay circuit, formed on a master slice IC, according to an embodiment of the present invention.

FIG. 5A is a circuit diagram of a unit cell including a delay circuit, formed on a master slice IC, according to an embodiment of the present invention. The unit cell is usually constructed using one to several tens of basic cells. Referring to FIG. 5A, two complimentary-metal-insulator or oxide-semiconductor (CMIS or CMOS) inverters $INV_1$ and $INV_2$ are illustrated. Each CMIS or CMOS inverter comprises a P-channel metal insulator or oxide semiconductor (MIS or MOS) transistor $Q_p$ and an N-channel MIS or MOS transistor $Q_n$. In the following description, only MOS and CMOS devices will be mentioned. However, MIS or CMIS devices may be applied. Between two CMOS inverters $INV_1$ and $INV_2$, a delay circuit DLY comprising a resistor R and a capacitor C connected to form an integrator is connected. The source of each P-channel MOS transistor $Q_p$ is connected to a power supply $V_{DD}$. The source of each N-channel MOS transistor $Q_n$ is connected to another power supply $V_{ss}$.

Figure 5B:
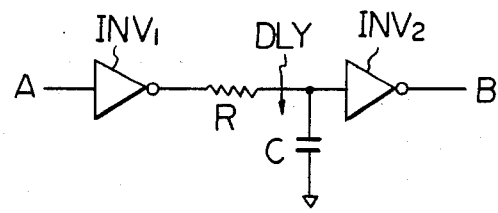
FIG. 5B is an equivalent circuit diagram of FIG. 5A.

FIG. 5B is an equivalent circuit diagram of FIG. 5A.

Figure 6:
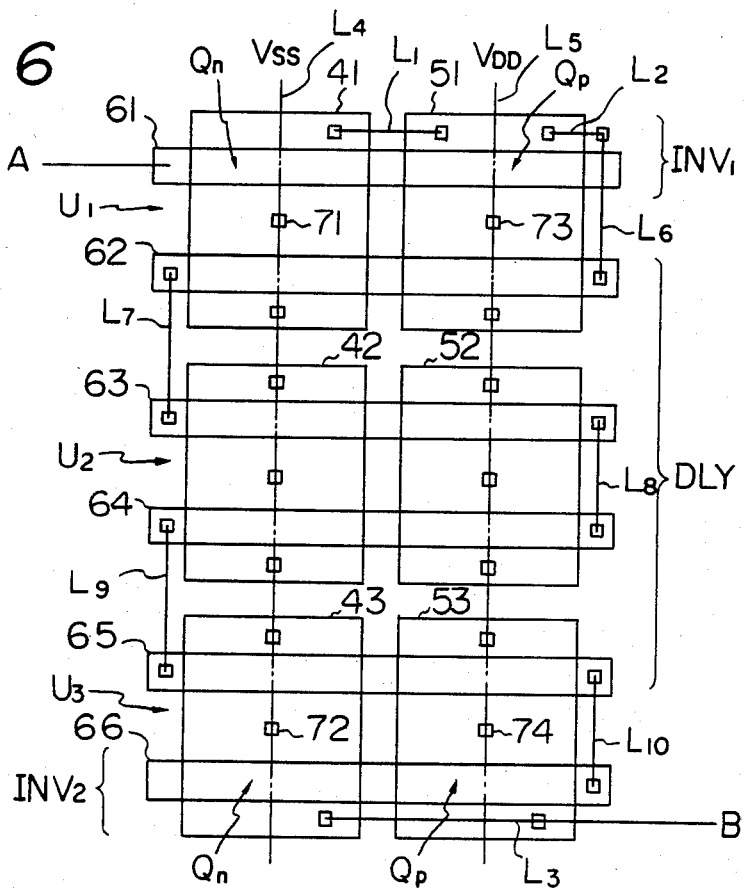
FIG. 6 is a plan view of the structure of the basic cell of FIG. 5A.

FIG. 6 is a plan view of the structure of the unit cell of FIG. 5A. Referring to FIG. 6, three basic cells $U_1$, $U_2$, and $U_3$ are illustrated. A first half of the basic cell $U_1$ is used as the inverter $INV_1$. A first half of the basic cell $U_3$ is used as the inverter $INV_2$. The second half of the basic cell $U_1$, the basic cell $U_2$, and the second half of the basic cell $U_3$ are used as the delay circuit DLY. Each basic cell comprises two N-channel MOS transistors $Q_n$ and two P-channel MOS transistors $Q_p$. The N-channel MOS transistors $Q_n$ comprise drain and source regions 41, 42, and 43, respectively. The P-channel MOS transistors $Q_p$ comprise drain and source regions 51, 52, and 53. In the basic cell $U_1$, two conductive layers 61 and 62 extend parallel to each other over the regions 41 and 51 through insulating layers (not shown). Similarly, in the basic cells $U_2$ and $U_3$, two conductive layers 63 and 64 and two conductive layers 65 and 66 are provided. The conductive layers 61 through 66 act as gate electrodes of the transistors $Q_p$ and $Q_n$. The conductive layers 61 through 66 are formed of polysilicon and therefore have a relatively constant resistivity independent of temperature or manufacturing process. Thus, according to this embodiment, the conductive layers 62, 63, 64, and 65 are used as the resistor R for the delay circuit DLY. Also, there is a capacitance between each conductive layer and the region under the conductive layer. These capacitances are used as the capacitor C for the delay circuit DLY.

In the basic cell $U_1$, a CMOS inverter $INV_1$ having the conductive layer 61 as a common gate electrode is constructed by connecting the regions 41 and 51 with an aluminum wire $L_1$. Also, in the basic cell $U_3$, a CMOS inverter $INV_2$ having the conductive layer 66 as a common gate electrode is constructed by connecting the regions 43 and 53 with an aluminum wire $L_3$. A power supply line $V_{SS}$ is provided with an aluminum wire $L_4$ which is in contact with contact holes 71 and 72 at the central portions of the regions 41 and 43, respectively. The contact holes 71 and 72 are provided in the source regions of the transistors $Q_n$. Another power supply line $V_{DD}$ is provided with an aluminum wire $L_5$ which is in contact with contact holes 73 and 74 at the central portions of the regions 51 and 53, respectively. The contact holes 73 and 74 are provided in the source regions of the transistors $Q_p$. The source region of the transistor $Q_p$, which is connected to the drain region of the transistor $Q_n$ by the aluminum wire $L_1$, is connected to an end of the conductive layer 62 by aluminum wires $L_2$ and $L_6$. The other end of the conductive layer 62 is connected through an aluminum wire $L_7$ to an end of the conductive layer 63. Similarly, the ends of the conductive layers 63 and 64, 64 and 65, 65 and 66 are connected together through the aluminum wires $L_8$, $L_9$, and $L_{10}$, respectively. As mentioned before, the conductive layers 62, 63, 64, and 65 between the inverters $INV_1$ and $INV_2$ form the resistor R and the capacitor C in the delay circuit DLY. Thus, the output of the inverter $INV_1$, which is the drain of the transistor $Q_p$ or the drain of the transistor $Q_n$, is connected through the delay circuit to the input of the inverter $INV_2$, i.e., to the conductive layer 66. Therefore, an input signal A applied to the input of the inverter $INV_1$ or to the conductive layer 61 is delayed by the delay circuit DLY to provide an output signal B at the output of the inverter $INV_2$ on the line $L_3$ which connects the source region of the transistor $Q_p$ to the drain region of the transistor $Q_n$.

The delay time obtained from the delay circuit DLY depends on the number of conductive lines between the inverters $INV_1$ and $INV_2$. In the embodiment illustrated in FIG. 6, the delay circuit DLY is constructed by the four conductive lines 62 through 65. Two conductive lines require an area of one basic cell. Therefore, the delay circuit is constructed by two basic cells. An example of the relation between the delay time and the number of the unit cells of the delay circuit, which is constructed in FIG. 6 by the conductive lines 62, 63, 64 and 65, is represented in the following table, in which the delay time does not include the transmission time through the inverter.

| Number of basic cells | Delay time (ns) |
| --- | --- |
| 1 | 3.8 |
| 2 | 15.2 |
| 3 | 34.2 |
| 4 | 60.8 |
| 5 | 95.0 |

As is seen from the above table, in order to obtain a delay time of, for example, 95 ns, only five basic cells are required according to the present invention. In contrast, in order to obtain the same delay time of 95 ns by utilizing the transmission time through inverters, 48 basic cells are required. Therefore, according to the present invention, the area required for the delay circuit is greatly reduced in comparison with the conventional method.

The advantages of the method for constructing the delay circuits in a master slice IC according to the present invention are that (1) a more precise delay time can be realized because the delay time is determined by the resistance and the capacitance of the fixed pattern or the fixed unit cells, instead of being determined by the transmission time through the logic cells as in the conventional method and (2) by registering information regarding wirings of a delay circuit into a computer, the delay circuit can be formed by an automatic wiring according to a computer-aided design, as the other logic cells are formed.

Figure 7:
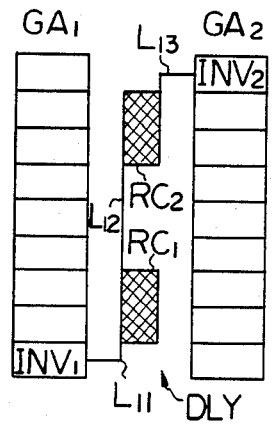
FIG. 7 is a plan view of a second embodiment, not included in the present claims, of a part of a master slice IC including RC delay circuits.

FIG. 7 is a plan view of another example of part of a master slice IC including RC delay circuits. Referring to FIG. 7, $GA_1$ and $GA_2$ are two adjacent gate arrays corresponding to the array of the regions 41, 42, and 43 and the array of the regions 51, 52, and 53 of FIG. 6, respectively. In each gate array, transistor regions, such as the regions 41, 42, . . . in FIG. 6, are regularly arranged. Between the two adjacent gate arrays, there is a space utilized for wiring. This space can also be utilized to form delay circuits. That is, as illustrated in FIG. 7, delay circuits $RC_1$ and $RC_2$ including resistances and capacitances can be formed in the space by forming diffusion layers or polysilicon layers therein. By connecting these delay circuits $RC_1$ and $RC_2$ through an aluminum wire $L_{12}$, the delay circuit DLY is formed. Then, by selectively connecting the delay circuit DLY between an inverter $INV_1$ in the gate array $GA_1$ and an inverter $INV_2$ in the gate array $GA_2$ through the aluminum wires $L_{11}$ and $L_{13}$, respectively, a desired delay circuit DLY can be obtained between the inverters $INV_1$ and $INV_2$. According to the example of FIG. 7, a relatively large delay time can be obtained by utilizing a small space. However, the required positions, the required number, or the required delay time of the delay circuit is not known during the manufacturing process of the master slice IC. Therefore, a number of such delay circuits must be formed in the spaces between adjacent gate arrays, then the desired number of delay circuits can be practically used. As a result, a large number of the spaces are wasted due to the unused delay circuits. However according to the present invention, a desired delay time can be obtained at a desired position on the master slice IC.

The present invention is not restricted to the above-mentioned embodiment, but various changes and modifications are possible without departing from the spirit of the invention. For example, the above-mentioned embodiment of FIG. 6 may be combined with the example of FIG. 7. Also, instead of using the diffusion layers in FIG. 7, MOS resistors may be used as the resistors of the delay circuits.

I claim:

1. A method for constructing delay circuits in a master slice IC having a semiconductor substrate and having an insulating film formed on the semiconductor substrate, said method comprising the steps of:
    (a) forming a plurality of basic cells arranged in parallel in an array, the basic cells including MIS transistors, each of the MIS transistors having a gate electrode formed through the insulating film on the semiconductor substrate, having a source, and having a drain, the gate electrodes of the MIS transistors formed parallel to each other;
    (b) selecting a wiring pattern for connecting the basic cells to form various logic circuits, including forming an input logic circuit having an output and an output logic circuit having an input; and
    (c) connecting one or more of the parallel gate electrodes of the MIS transistors in at least one of the basic cells and connecting the sources and drains of the MIS transistors to form a delay circuit between two of the logic circuits, the delay circuit comprising a resistance derived from the gate electrodes and a capacitance formed between the gate electrodes and the semiconductor substrate, comprising the substeps of:
        (i) sequentially connecting the output of the input logic circuit to a first end of a first one of the gate electrodes adjacent to the input logic circuit;
        (ii) connecting a second end of the first one of the gate electrodes to a first end of a second one of the gate electrodes adjacent to the first one of the gate electrodes; and
        (iii) connecting a second end of a last one of the gate electrodes adjacent to the output logic circuit, to the input of the output logic circuit.

2. A method as claimed in claim 1, wherein said step (a) of forming a plurality of basic cells comprises the substep of forming a plurality of P-channel MIS transistors and N-channel MIS transistors, the P-channel MIS transistors and the N-channel MIS transistors being arranged in a predetermined standard pattern on the semiconductor substrate, the P-channel MIS transistors forming P-channel gate arrays, and the N-channel MIS transistors forming N-channel gate arrays.

3. A method as claimed in claim 2, wherein said selecting step (b) comprises forming logic circuits which comprise at least two CMIS inverters, each of the CMIS inverters comprising one of the P-channel MIS transistors and one of the N-channel MIS transistors, and wherein the delay circuit is operatively connected between the two CMIS inverters.

4. A method as claimed in claim 3, wherein said step (c) further comprises the substep of connecting the gate electrodes using aluminum wires.

5. A method for constructing delay circuits in a master slice IC having a semiconductor substrate, comprising the steps of:
    (a) forming source regions and drain regions on the semiconductor substrate of the master slice IC;

(b) forming an insulating layer on portions of the source regions, the drain regions and the semiconductor substrate;

(c) forming substantially parallel conductive layers on the insulating layer, a capacitance being formed between the conductive layers and the semiconductor substrate;

(d) forming basic cells parallel to each other, including transistors having gate electrodes formed parallel to each other, by connecting the source and drain regions and the conductive layers, including forming an input logic circuit having an output and an output logic circuit having an input; and (e) forming a delay circuit from at least one of the basic cells by sequentially connecting one or more of the gate electrodes, the delay circuits having a capacitor and a resistor, the capacitance between the substantially parallel conductive layers and the semiconductor substrate forming the capacitor and the substantially parallel conductive layers have a resistance forming the resistor, comprising the sub-steps of:

(i) sequentially connecting the output of the input logic circuit to a first end of a first one of the gate electrodes adjacent to the input logic circuit;

(ii) connecting a second end of the first one of the gate electrodes to a first end of a second one of the gate electrodes adjacent to the first one of the gate electrodes; and (iii) connecting a second end of a last one of the gate electrodes adjacent to the output logic circuit, to the input of the output logic circuit.

* * * * *